(12) United States Patent
Chen

(10) Patent No.: US 8,593,613 B2
(45) Date of Patent: Nov. 26, 2013

(54) LCD EXPOSURE STAGE DEVICE AND EXPOSURE SYSTEM

(75) Inventor: Hsiao-hsien Chen, Shenzhen (CN)

(73) Assignee: Shenzhen China Star Optoelectronics Technology Co., Ltd., Shenzhen (CN)

( * ) Notice: Subject to any disclaimer, the term of this patent is extended or adjusted under 35 U.S.C. 154(b) by 69 days.

(21) Appl. No.: 13/377,151

(22) PCT Filed: Sep. 17, 2011

(86) PCT No.: PCT/CN2011/079783
§ 371 (c)(1),
(2), (4) Date: Dec. 9, 2011

(87) PCT Pub. No.: WO2013/037139
PCT Pub. Date: Mar. 21, 2013

(65) Prior Publication Data
US 2013/0063709 A1      Mar. 14, 2013

(30) Foreign Application Priority Data
Sep. 13, 2011   (CN) .......................... 2011 2 0341726

(51) Int. Cl.
*G02F 1/13* (2006.01)
*B27B 31/04* (2006.01)
*H01L 21/68* (2006.01)

(52) U.S. Cl.
USPC ........... 349/187; 349/123; 156/580; 414/781; 414/783

(58) Field of Classification Search
USPC .......... 349/187, 189–191, 123; 414/757, 781, 414/783; 156/580
See application file for complete search history.

(56) References Cited

U.S. PATENT DOCUMENTS 7,104,535 B2 * 9/2006 Kurita et al. .................. 269/303

FOREIGN PATENT DOCUMENTS

| CN | 1591816 A |   | 3/2005 |
| CN | 1591816 A | * | 3/2005 |

OTHER PUBLICATIONS

International Search Report of the PCT Application No. PCT/CN2011/079783.

* cited by examiner

*Primary Examiner* — Nathanael R Briggs

(57) ABSTRACT

An LCD exposure stage device is used for placing a substrate thereon, and comprises: a stage having an upper surface contacting with a bottom surface of the substrate; and a plurality of moving pins disposed flat on the upper surface of the stage with pin heads thereof corresponding to side surfaces of the substrate respectively so that the substrate can move horizontally by the moving pins. According to the present disclosure, only the substrate needs to be moved, so the operations are more convenient; and because the stage is always kept at a fixed position, the requirement on its strength can be appropriately lowered. Furthermore, because the substrate contacts with the stage all the time during the moving and exposure processes, and the time necessary for the exposure process is shortened, which make fabrication of the whole LCD panel more efficient.

16 Claims, 6 Drawing Sheets

LCD EXPOSURE STAGE DEVICE AND EXPOSURE SYSTEM

BACKGROUND

1. Technical Field

The present disclosure relates to LCD exposure technologies, and more particularly, to an LCD exposure stage device and an exposure system.

2. Description of Related Art

During the fabrication process of liquid crystal display (LCD) panels and particularly thin film transistor (TFT) LCD panels, metal materials, insulation layers or the like need to be sputtered on a TFT substrate to form a TFT array having gates, sources, drains, pixel electrodes and passivation layers through multiple exposure processes; or fine pigments are applied to a color filter substrate to form a color filter pattern through exposure.

A prior art LCD exposure system comprises a stage device and an illumination device. A substrate is placed on a stage of the stage device, and during the exposure process, a to-be-exposed region of the substrate is moved to an exposure region of the illumination device by moving the stage. Because the prior art stage device is bulky, it is very inconvenient to move the stage. There is also another kind of LCD exposure system which employs a clamp to lift a substrate. In the latter LCD exposure system, it is only necessary to move the stage device slightly to result in relative movement between the substrate and the stage device; and after the substrate is placed in place, the stage device is moved back to its original position. Then, an exposure region of an illumination device is moved to the to-be-exposed region of the substrate for exposure. However, this kind of LCD exposure system requires multiple times of separation of the substrate from the stage device, which leads to a long manufacturing time.

BRIEF SUMMARY

The primary objective of the present disclosure is to provide an LCD exposure stage device and an LCD exposure system that are convenient to operate and that require a short manufacturing time.

The present disclosure provides an LCD exposure stage device, which comprises:

a stage, having an upper surface that makes contact with a bottom surface of a substrate;

a plurality of moving pins, being disposed flat on the upper surface of the stage and distributed at sides of the substrate; and a plurality of driving mechanisms, being connected to the moving pins distributed at the sides of the substrate respectively and being adapted to drive the moving pins to make contact with side surfaces of the substrate so as to move the substrate.

Preferably, axes of the moving pins are perpendicular to corresponding side surfaces of the substrate, and the driving mechanisms drive the moving pins to move along directions of the axes of the moving pins.

Preferably, the moving pins are distributed at the sides of the substrate in groups of at least two, and the moving pins in each group are parallel to each other.

Preferably, the stage is formed with a plurality of vent holes, and a lower venting end of each of the vent holes communicates with an external air blowing/sucking device through a venting pipe.

Preferably, axes of the venting holes are perpendicular to the upper surface of the stage.

Preferably, the LCD exposure stage device further comprises a plurality of supporting pins connected to the driving mechanisms respectively, the stage is further formed with a plurality of through-holes whose axes are perpendicular to the upper surface of the stage, and the supporting pins pass through the through-holes and are driven by the driving mechanisms to move respectively.

Preferably, the number of the through-holes is three, and lines connecting the through-holes form a polygon.

The present disclosure further provides an LCD exposure stage device, which comprises:

a stage, having an upper surface that makes contact with a bottom surface of a substrate;

a plurality of moving pins, being disposed flat on the upper surface of the stage and distributed at sides of the substrate; and a plurality of driving mechanisms, being connected to the moving pins distributed at the sides of the substrate respectively and being adapted to drive the moving pins to make contact with side surfaces of the substrate so as to move the substrate, axes of the moving pins are parallel to corresponding side surfaces of the substrate, and the driving mechanisms drive the moving pins to move along directions perpendicular to the axes of the moving pins.

Preferably, the stage is formed with a plurality of vent holes, and a lower venting end of each of the vent holes communicates with an external air blowing/sucking device through a venting pipe.

Preferably, axes of the venting holes are perpendicular to the upper surface of the stage.

Preferably, the LCD exposure stage device further comprises a plurality of supporting pins connected to the driving mechanisms respectively, the stage is further formed with a plurality of through-holes whose axes are perpendicular to the upper surface of the stage, and the supporting pins pass through the through-holes and are driven by the driving mechanisms to move along the through-holes respectively.

Preferably, the number of the through-holes is three, and lines connecting the through-holes form a polygon.

The present disclosure further provides an LCD exposure system for exposing a substrate, which comprises:

an illumination device located above the substrate for illuminating an exposure surface of the substrate; and an LCD exposure stage device, comprising:

a stage, having an upper surface that makes contact with a bottom surface of a substrate;

a plurality of moving pins, being disposed flat on the upper surface of the stage and distributed at sides of the substrate; and a plurality of driving mechanisms, being connected to the moving pins distributed at the sides of the substrate respectively and being adapted to drive the moving pins to make contact with side surfaces of the substrate so as to move the substrate.

Preferably, axes of the moving pins are perpendicular to corresponding side surfaces of the substrate, and the driving mechanisms drive the moving pins to move along directions of the axes of the moving pins.

Preferably, the moving pins are distributed at the sides of the substrate in groups of at least two, and the moving pins in each group are parallel to each other.

Preferably, the LCD exposure system further comprises an air blowing/sucking device, the stage is formed with a plurality of vent holes, and a lower venting end of each of the vent holes communicates with the external air blowing/sucking device through a venting pipe.

Preferably, axes of the venting holes are perpendicular to the upper surface of the stage.

Preferably, the LCD exposure stage device further comprises a plurality of supporting pins connected to the driving mechanisms respectively, the stage is further formed with a plurality of through-holes whose axes are perpendicular to the upper surface of the stage, and the supporting pins pass through the through-holes and are driven by the driving mechanisms to move respectively.

Preferably, the number of the through-holes is at least three, and lines connecting the through-holes form a polygon.

According to the present disclosure, it is only necessary to move the substrate without having to move the stage or the whole LCD exposure stage device, so the operations are made more convenient; and because the stage is always kept at a fixed position, the requirement on its strength can be appropriately lowered. Furthermore, because the substrate make contact with the stage all the time during the moving and exposure processes, separation of the substrate from the stage is avoided and the time necessary for the exposure process is shortened, which make fabrication of the whole LCD panel more efficient.

Hereinafter, implementations, functional features and advantages of the present disclosure will be further described with reference to embodiments thereof and the attached drawings.

DETAILED DESCRIPTION

It shall be understood that, the embodiments described herein are only intended to illustrate but not to limit the present disclosure.

Figure 1:
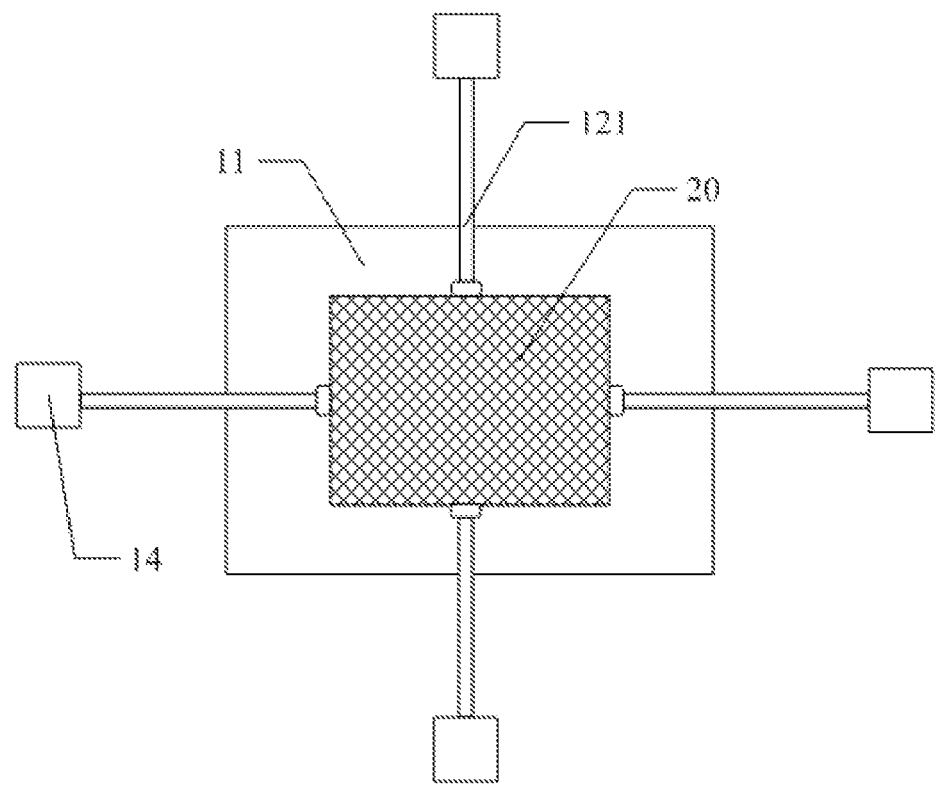
FIG. 1 is a top view of an LCD exposure stage device according to a first embodiment of the present disclosure.

Referring to FIG. 1, there is shown a top view of an LCD exposure stage device according to a first embodiment of the present disclosure. As shown therein, the LCD exposure stage device of this embodiment comprises:

a stage 11, having an upper surface that makes contact with a bottom surface of a substrate 20;

a plurality of moving pins 121, being disposed flat on the upper surface of the stage 11 and distributed at sides of the substrate 20; and a plurality of driving mechanisms 14, being connected to the moving pins 121 distributed at sides of the substrate 20 respectively and being adapted to drive the moving pins 121 to make contact with side surfaces of the substrate 20 so as to move the substrate 20.

According to this embodiment, by having pin heads of the moving pins 121 make contact with side surfaces of the substrate 20 and using the driving mechanisms 14 to drive the moving pins 121 to move the substrate 20 on the stage 11, it is only necessary to move the substrate 20 to a desired exposure region for exposure. This eliminates the need of moving the stage 11 or the whole LCD exposure stage device, so the operations are made more convenient; and because the stage 11 is always kept at a fixed position, the requirement on its strength can be appropriately lowered. Furthermore, because the substrate 20 makes contact with the stage 11 all the time during the moving and exposure processes, separation of substrate 20 from the stage 11 is avoided and the time necessary for the exposure process is shortened, which make fabrication of the whole LCD panel more efficient.

The number of the moving pins 121 is at least four, and the moving pins 121 are disposed near four side surfaces of the substrate 20 respectively.

In this embodiment, each of the four side surfaces of the substrate 20 corresponds to a moving pin 121, and the four moving pins 121 cooperate with each other to locate the substrate 20. If more moving pins 121 are used at each side of the substrate 20, the moving direction and the position of the substrate 20 can be controlled in a better way, which is favorable for moving to the exposure region accurately to ensure the exposure quality.

Figure 2:
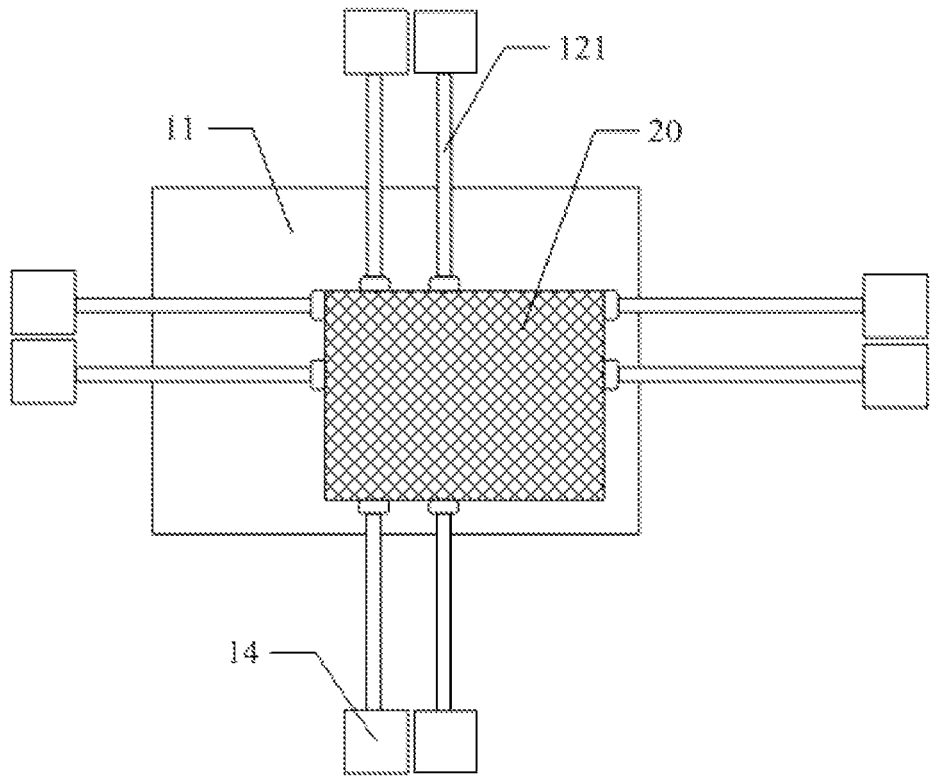
FIG. 2 is a top view of an LCD exposure stage device according to a second embodiment of the present disclosure, in which the LCD exposure stage device is provided with moving pins perpendicular to the side surfaces of the substrate.

Referring to FIG. 2, there is shown a top view of an LCD exposure stage device according to a second embodiment of the present disclosure, in which the LCD exposure stage device is provided with moving pins perpendicular to the side surfaces of the substrate.

As shown therein, axes of the moving pins 121 are perpendicular to corresponding side surfaces of the substrate 20 respectively, and the driving mechanisms 14 drive the moving pins 121 to move in directions of respective axes of the moving pins 121.

The moving pins are disposed at sides of the substrate in groups of at least two respectively, and individual moving pins in each group are parallel to each other.

In this embodiment, the moving pins 121 are disposed corresponding to each side surfaces of the substrate 20 respectively, and the moving pins 121 are driven by the driving mechanisms 14 to move linearly in directions of respective pin bodies. The driving mechanisms 14 may be motors. When pin heads of the individual moving pins 121 make contact with corresponding side surfaces of the substrate 20 respectively, the moving pins 121 at opposite sides will move in coordination in the same direction and by the same distance so that the substrate 20 is pushed also in the same direction and by the same distance to the desired exposure region. In this embodiment, there are eight moving pins 12, with each side surface of the substrate 20 corresponding to two moving pins 121. Then, by applying forces of the same magnitude to two contact points simultaneously at each side surface, it can be ensured that the substrate 20 moves in a correct direction to the desired exposure region. This can prevent misalignment in the photolithographic process due to a deviation of the exposure position, so the exposure quality can be ensured. Moreover, the boundary positions of individual exposure modules in the exposed substrate 20 are parallel to each other, which makes it convenient to perform subsequent processes such as the assembling process or the dicing process.

Figure 3:
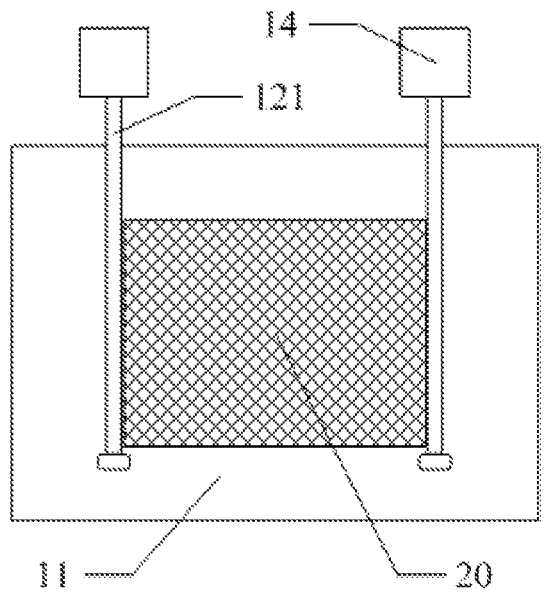
FIG. 3 is a top view of an LCD exposure stage device according to a third embodiment of the present disclosure, in which the LCD exposure stage device is provided with moving pins parallel to the side surfaces of the substrate.

Referring to FIG. 3, there is shown a top view of an LCD exposure stage device according to a third embodiment of the present disclosure, in which the LCD exposure stage device is provided with moving pins parallel to the side surfaces of the substrate.

As shown therein, axes of the moving pins 121 are parallel to corresponding side surfaces of the substrate 20, and the driving mechanisms 14 drive the moving pins 121 to move in directions perpendicular to respective axes of the moving pins 121.

In this embodiment, the moving pins 121 are driven by the driving mechanisms 14 to move in directions perpendicular to respective axes of the moving pins 121 with the substrate 20 being moved by pin bodies of the moving pins 121, so the longitudinal driving distance of the motor can be reduced.

Figure 4:
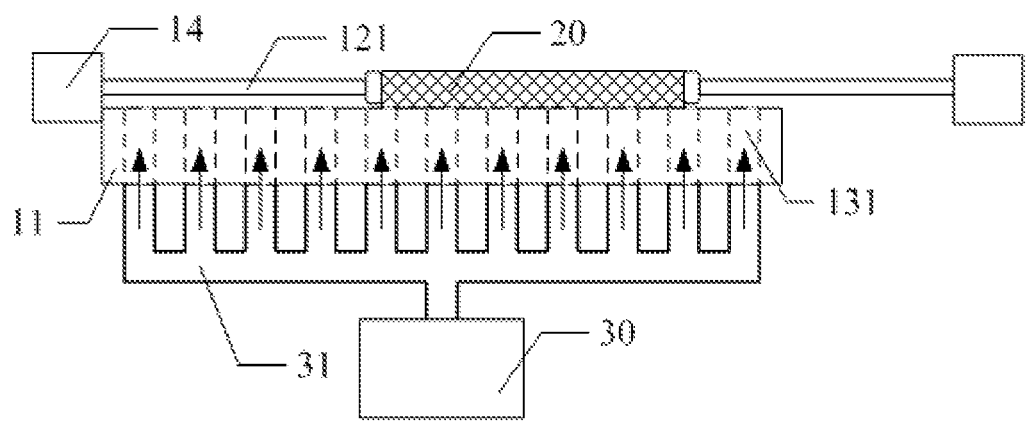
FIG. 4 is a side view of an LCD exposure stage device according to the first embodiment when air is blow through the venting holes.
Figure 5:
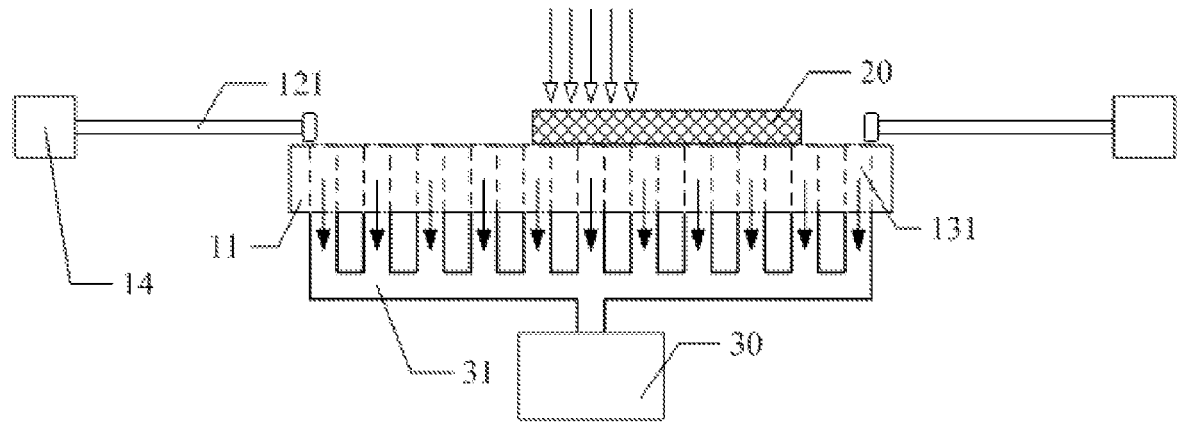
FIG. 5 is a side view of an LCD exposure stage device according to the first embodiment when air is sucked through the venting holes.

Referring to FIG. 4 and FIG. 5 together, FIG. 4 is a side view of an LCD exposure stage device according to FIG. 1 shows the first embodiment when air is blown through the venting holes, and FIG. 5 is a side view of an LCD exposure stage device according to FIG. 1 shows the first embodiment when air is sucked through the venting holes.

The stage 11 is formed with a plurality of venting holes 131, and a lower venting end of each of the venting holes 131 communicates with an external air blowing/sucking device 30 through a venting pipe 31.

Axes of the venting holes 131 are perpendicular to the upper surface of the stage 11.

Here, the external air blowing/sucking device 30 may be an air inlet/outlet device in a factory.

As shown in FIG. 4, in this embodiment, when it is desired to move the substrate 20 in a horizontal direction, air is blown by the external air blowing/sucking device 30 into the venting holes 131 to apply a force, which is slightly greater than or equal to the gravity of the substrate 20, to the substrate 20 placed above the venting holes 131 so that the substrate 20 is lifted upwards slightly. This makes it convenient for the moving pins 121 to push the substrate 20 to move in the horizontal direction.

As shown in FIG. 5, in this embodiment, when the substrate 20 arrives in the exposure region, the external air blowing/sucking device 30 sucks air through the venting holes 30. By the suction force of the air flow, the substrate 20 is fixed on the upper surface of the stage 11 to ensure a fixed position of the substrate 20 during the exposure process, thus ensuring the exposure quality.

Figure 6:
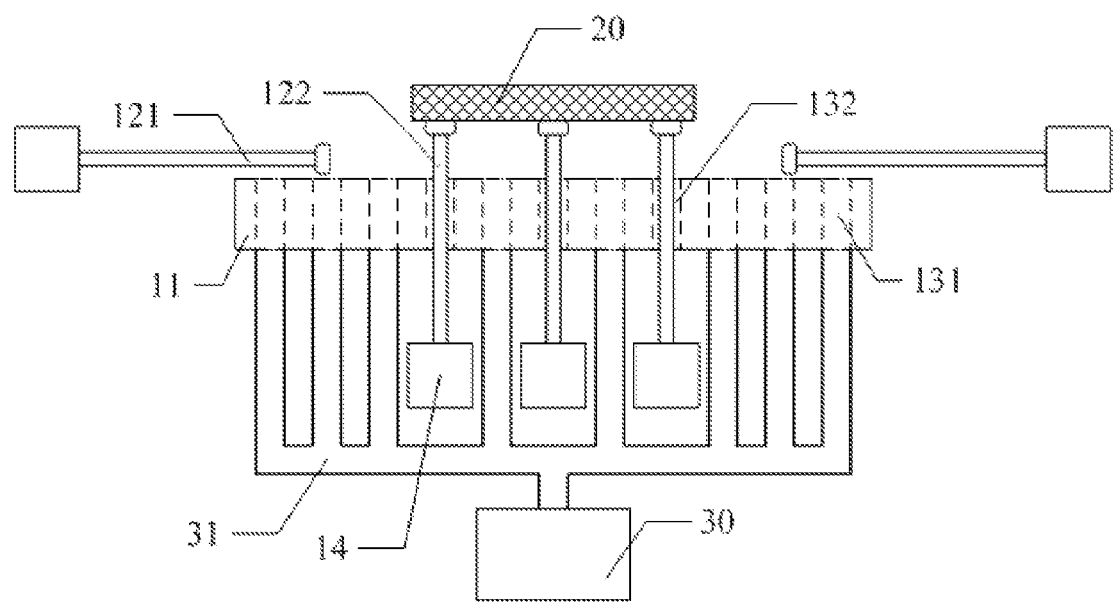
FIG. 6 is a side view of an LCD exposure stage device according to a fourth embodiment of the present disclosure when the substrate is being lifted up by supporting pins.
Figure 7:
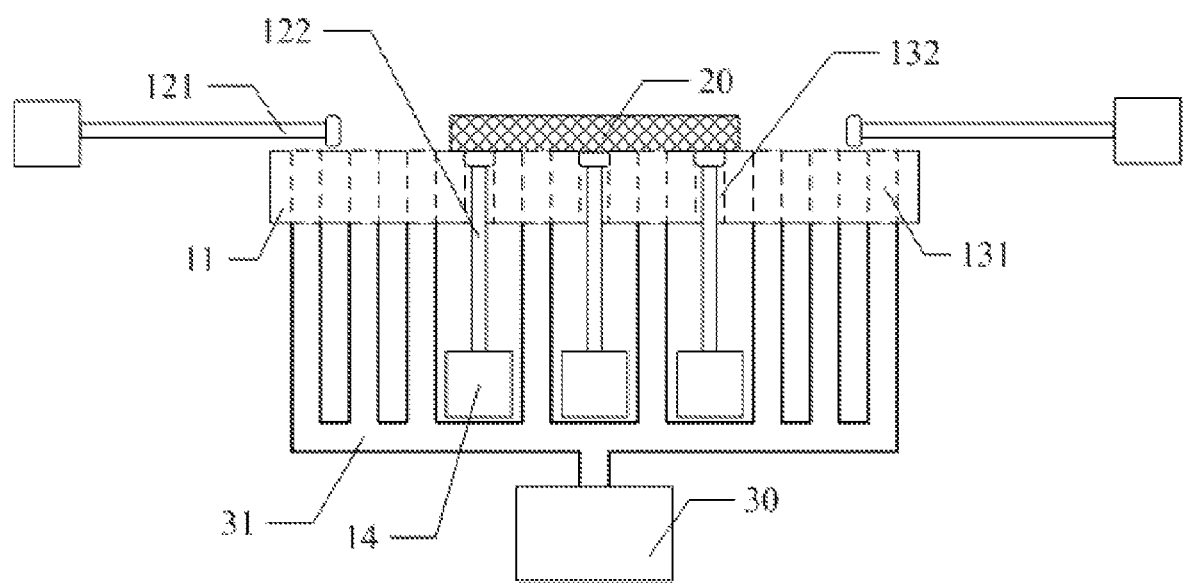
FIG. 7 is a side view of the LCD exposure stage device according to the fourth embodiment when the supporting pins descend to put down the substrate.

Referring to FIG. 6 and FIG. 7 together, FIG. 6 is a side view of an LCD exposure stage device according to a fourth embodiment of the present disclosure when the substrate is being lifted up by supporting pins; and FIG. 7 is a side view of the LCD exposure stage device according to the fourth embodiment shown in FIG. 6 when the supporting pins descend to put down the substrate.

The LCD exposure stage device further comprises a plurality of supporting pins 122 connected to the driving mechanisms 14 respectively. The stage 11 is further formed with a plurality of through-holes 132 whose axes are perpendicular to the upper surface of the stage 11, and the supporting pins 132 pass through the through-holes 132 and are driven by the driving mechanisms 14 to move along the through-holes 132.

As shown in FIG. 6, in this embodiment, the substrate 20 is placed on the supporting pins 122 prior to the exposure process, and then the supporting pins 122 descend to put the substrate 20 on the upper surface of the stage 11.

As shown in FIG. 7, in this embodiment, the substrate 20 is returned to the original position after the exposure process is completed, and then the supporting pins 122 rise to lift the substrate 20 upwards so that the exposed substrate 20 is unloaded from the supporting pins 122.

The supporting pins 122 make the process of loading the substrate 20 onto the stage 11 and unloading the substrate 20 from the stage 11 more convenient.

Additionally, in the embodiment of the present disclosure, the number of the through-holes 132 is at least three, and lines connecting the through-holes 132 form a polygon. The through-holes 132 are distributed not in a same straight line so that lines connecting the ends of the supporting pins 122 that pass through the through-holes 132 can form a plane for supporting the substrate 20 to ensure stable placement of the substrate 20 on the supporting pins 122. This plane shall be kept to be parallel with the upper surface of the stage 11 as far as possible to form a horizontal tray. Thereby, the substrate 20 can be placed on the pin heads in a balanced status without being inclined or falling off due to unevenness of the pin heads. Further, more supporting pins 122 may be disposed to ensure a better balanced status of the substrate 20. However, it would become inappropriate if too many supporting pins 122 are disposed because the through-holes 132 corresponding to the too many supporting pins 122 would reduce the space for disposing the venting holes 131 on the stage 11, and this would cause the blowing or suction force applied by the air flow to be smaller than that required to lift or fixing the substrate 20. Additionally, both the through-holes 132 and the supporting pins 122 are perpendicular to the upper surface of the stage. This, on one hand, facilitates movement of the supporting pins 122 in the through-holes 132, and on the other hand, facilitates application of an even force by the supporting pins 122 when lifting the substrate 20 upwards so that the substrate 20 is kept in a balanced status without being inclined or falling off due to uneven application of the force. Moreover, because the supporting pins 122 pass through the through-holes 132, the length of the supporting pins 122 must be greater than the length of the through-holes 132 (i.e., the thickness of the stage 11) in order to ensure that the supporting pins 122 can extend out of the through-holes 132 to lift the substrate 20 upwards.

Figure 8:
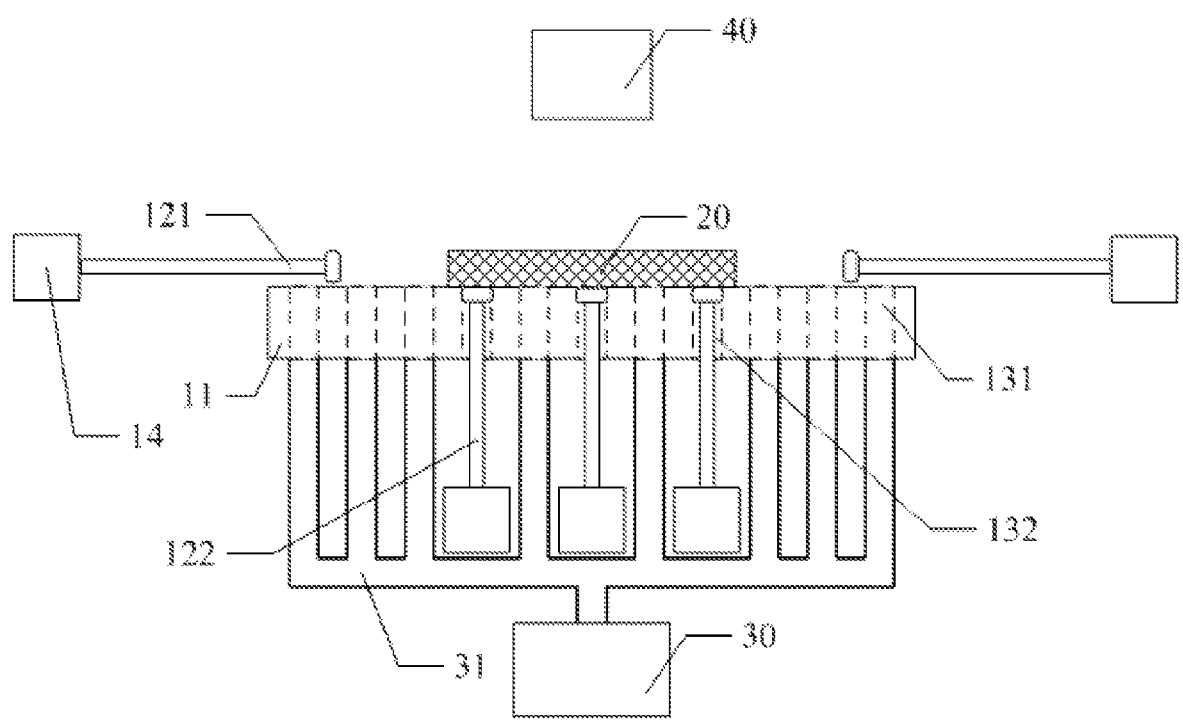
FIG. 8 is a side view of an LCD exposure system for exposing a substrate according to a fifth embodiment of the present disclosure.

Referring to FIG. 8, there is shown a side view of an LCD exposure system according to a fifth embodiment of the present disclosure. The LCD exposure system is used for exposing a substrate, and comprises:

an LCD exposure stage device; and an illumination device 40 disposed above the substrate 20 for illuminating an exposure surface of the substrate 20.

In this embodiment, firstly, the substrate 20 is placed on the supporting pins 122 that have risen, and then the supporting pins 122 descend to put the substrate 20 on the stage 11; by using the external air blowing/sucking device 30 to blow air into the venting holes 131, the substrate 20 is slightly lifted upwards, and is moved horizontally by the moving pins 121 in a direction of the pin bodies of the moving pins 121 to an exposure region below the illumination device 40; then the external air blowing/sucking device 30 sucks air through the venting holes 131 to fix the substrate 20 on the stage 11 and the moving pins 121 are withdrawn so that a to-be-exposed region of the substrate 20 is exposed by the illumination device 40 above the substrate 20 to form an exposure module; upon completion of the exposure, air is blown into the venting holes 131 by the external air blowing/sucking device 30 again and the substrate 20 is pushed back to the original position by the moving pins 121; and finally, the supporting pins 122 rise to lift the substrate 20 upwards so that the substrate 20 is unloaded from the LCD exposure stage device. According to this embodiment, it is only necessary to move the substrate 20 to the desired exposure region simply by use of the moving pins 121 without having to move the stage 11 or the whole LCD exposure stage device, so the operations are made more convenient; and because the stage 11 is always kept at a fixed position, the requirement on its strength can be appropriately lowered. Furthermore, because the substrate 20 is only slightly lifted upwards by the external air blowing/sucking device 30 during the moving and exposure processes, the substrate 20 is substantially kept in contact with the stage 11; this avoids separation of the substrate from the stage and reduces the time necessary for the exposure process, thus making fabrication of the whole LCD panel more efficient.

Figure 9:
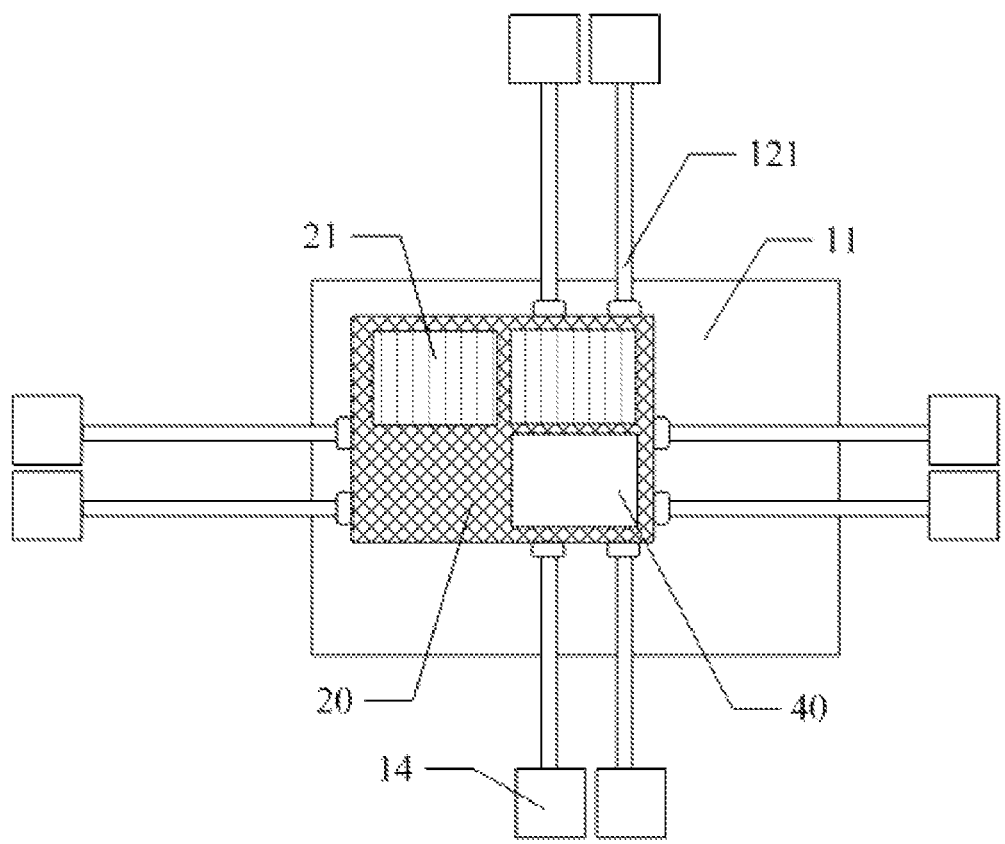
FIG. 9 is a top view of an LCD exposure system according to the fifth embodiment in preparation for a third exposure.

Referring to FIG. 9, there is shown a top view of an LCD exposure system according to FIG. 8 shows the fifth embodiment in preparation for a third exposure.

In this embodiment, two exposure modules 21 are formed on the substrate 20 after two exposure processes, and the moving pins 121 then move a third to-be-exposed exposure region of the substrate 20 to below the illumination device 40 so that the substrate 20 is illuminated by the illumination device 40 for exposure. In this embodiment, the moving pins 121 are repeatedly used to move the substrate 20 without having to move the stage 11 or the whole LCD exposure stage device, so the operations are made more convenient and the requirement on strength of the stage 11 can be appropriately lowered. Furthermore, this avoids separation of the substrate from the stage and shortens the time necessary for the exposure process, thus making fabrication of the whole LCD panel more efficient.

What described above are only preferred embodiments of the present disclosure but are not intended to limit the scope of the present disclosure. Accordingly, any equivalent structural or process flow modifications that are made on basis of the specification and the attached drawings or any direct or indirect applications in other technical fields shall also fall within the scope of the present disclosure.

What is claimed is:

1. An LCD exposure stage device, comprising:
    a stage, having an upper surface that makes contact with a bottom surface of a substrate;
    a plurality of moving pins, being disposed flat on the upper surface of the stage and distributed at sides of the substrate; and
    a plurality of driving mechanisms, being connected to the moving pins distributed at the sides of the substrate respectively and being adapted to drive the moving pins to make contact with side surfaces of the substrate so as to move the substrate;
    wherein the stage is formed with a plurality of vent holes, and a lower venting end of each of the vent holes communicates with and external air blowing/sucking device through a venting pipe; air is blown by the external air blowing/sucking device into the vent holes to apply a force, which is slightly grater than or equal to the gravity of the substrate, to the substrate placed above the vent holes so that the substrate is lifted upwards slightly; the substrate is substantially kept in contact with the stage during moving an exposure processes.

2. The LCD exposure stage device of claim 1, wherein axes of the moving pins are perpendicular to corresponding side surfaces of the substrate, and the driving mechanisms drive the moving pins to move along directions of the axes of the moving pins.

3. The LCD exposure stage device of claim 2, wherein the moving pins are distributed at the sides of the substrate in groups of at least two, and the moving pins in each group are parallel to each other.

4. The LCD exposure stage device of claim 1, wherein axes of the venting holes are perpendicular to the upper surface of the stage.

5. The LCD exposure stage device of claim 4, further comprising a plurality of supporting pins connected to the driving mechanisms respectively, the stage is further formed with a plurality of through-holes whose axes are perpendicular to the upper surface of the stage, and the supporting pins pass through the through-holes and are driven by the driving mechanisms to move respectively.

6. The LCD exposure stage device of claim 5, wherein the number of the through-holes is three, and lines connecting the through-holes form a polygon.

7. An LCD exposure stage device, comprising:
    a stage, having an upper surface that makes contact with a bottom surface of a substrate;
    a plurality of moving pins, being disposed flat on the upper surface of the stage and distributed at sides of the substrate; and
    a plurality of driving mechanisms, being connected to the moving pins distributed at the sides of the substrate respectively and being adapted to drive the moving pins to make contact with side surfaces of the substrate so as to move the substrate,
    wherein axes of the moving pins are parallel to corresponding side surfaces of the substrate, and the driving mechanisms drive the moving pins to move along directions perpendicular to the axes of the moving pins;
    wherein the stage is formed with a plurality of vent holes, and a lower venting end of each of the vent holes communicates with an external air blowing/sucking device through a venting pipe; air is blown by the external air blowing/sucking device into the vent holes to apply a force, which is slightly greater than or equal to the gravity of the substrate, to the substrate place above the vent holes so that the substrate is lifted upwards slightly; the substrate substantially kept in contact with the stage during moving and exposure processes.

8. The LCD exposure stage device of claim 7, wherein axes of the venting holes are perpendicular to the upper surface of the stage.

9. The LCD exposure stage device of claim 8, further comprising a plurality of supporting pins connected to the driving mechanisms respectively, the stage is further formed with a plurality of through-holes whose axes are perpendicular to the upper surface of the stage, and the supporting pins pass through the through-holes and are driven by the driving mechanisms to move along the through-holes respectively.

10. The LCD exposure stage device of claim 9, wherein the number of the through-holes is three, and lines connecting the through-holes form a polygon.

11. An LCD exposure system for exposing a substrate, comprising:
    an illumination device located above the substrate for illuminating an exposure surface of the substrate; and
    an LCD exposure stage device, comprising:
        a stage, having an upper surface that makes contact with a bottom surface of a substrate;

a plurality of moving pins, being disposed flat on the upper surface of the stage and distributed at sides of the substrate; and a plurality of driving mechanisms, being connected to the moving pins distributed at the sides of the substrate respectively and being adapted to drive the moving pins to make contact with side surfaces of the substrate so as to move the substrate;

wherein the stage is formed with a plurality of vent holes, and a lower venting end of each of the vent holes communicates with an external air blowing/sucking device through a venting pipe; air is blown by the external air blowing/sucking device into the vent holes to apply a force, which is slightly greater than or equal to the gravity of the substrate, to the substrate place above the vent holes so that the substrate is lifted upwards slightly; the substrate substantially kept in contact with the stage during moving and exposure processes.

12. The LCD exposure system of claim 11, wherein axes of the moving pins are perpendicular to corresponding side surfaces of the substrate, and the driving mechanisms drive the moving pins to move along directions of the axes of the moving pins.

13. The LCD exposure system of claim 12, wherein the moving pins are distributed at the sides of the substrate in groups of at least two, and the moving pins in each group are parallel to each other.

14. The LCD exposure system of claim 11, wherein axes of the venting holes are perpendicular to the upper surface of the stage.

15. The LCD exposure system of claim 14, wherein the LCD exposure stage device further comprises a plurality of supporting pins connected to the driving mechanisms respectively, the stage is further formed with a plurality of through-holes whose axes are perpendicular to the upper surface of the stage, and the supporting pins pass through the through-holes and are driven by the driving mechanisms to move respectively.

16. The LCD exposure system of claim 15, wherein the number of the through-holes is at least three, and lines connecting the through-holes form a polygon.

* * * * *